United States Patent
Zommer

Patent Number: 6,147,393
Date of Patent: Nov. 14, 2000

[54] ISOLATED MULTI-CHIP DEVICES

[75] Inventor: Nathan Zommer, Los Altos, Calif.

[73] Assignee: Ixys Corporation, Santa Clara, Calif.

[21] Appl. No.: 08/907,173

[22] Filed: Aug. 6, 1997

Related U.S. Application Data

[63] Continuation-in-part of application No. 08/057,291, May 5, 1993.

[51] Int. Cl.[7] .................................................. H01L 29/00
[52] U.S. Cl. ........................ 257/501; 257/500; 257/777; 257/723
[58] Field of Search .................................. 257/777, 725, 257/759, 642, 643, 401, 723, 724, 140, 146, 500, 499, 506, 501

[56] References Cited

U.S. PATENT DOCUMENTS

| | | | |
|---|---|---|---|
| 4,089,766 | 5/1978 | Paal et al. | 204/192 |
| 4,341,594 | 7/1982 | Carlson et al. | 156/643 |
| 4,356,056 | 10/1982 | Cornette et al. | 156/649 |
| 4,423,547 | 1/1984 | Farrar et al. | 29/517 |
| 4,662,064 | 5/1987 | Hsu et al. | 29/591 |
| 4,695,867 | 9/1987 | Flohrs et al. | 357/46 |
| 4,758,476 | 7/1988 | Sekine et al. | 428/473 |
| 4,947,234 | 8/1990 | Einzinger et al. . | |
| 4,996,584 | 2/1991 | Young et al. | 357/71 |
| 5,008,736 | 4/1991 | Davies et al. . | |
| 5,012,322 | 4/1991 | Guillotte et al. . | |
| 5,031,021 | 7/1991 | Baba et al. | 357/53 |
| 5,162,258 | 11/1992 | Lemnios et al. | 437/184 |
| 5,266,746 | 11/1993 | Nishihara et al. | 174/254 |
| 5,275,973 | 1/1994 | Gelatos | 437/195 |
| 5,278,724 | 1/1994 | Angulas et al. | 361/707 |
| 5,288,541 | 2/1994 | Blackwell et al. | 428/209 |
| 5,339,216 | 8/1994 | Lin et al. . | |
| 5,339,217 | 8/1994 | Cohen et al. | 361/707 |
| 5,384,691 | 1/1995 | Neugebauer et al. | 361/794 |
| 5,473,181 | 12/1995 | Schwalke et al. . | |
| 5,475,263 | 12/1995 | Coady et al. . | |
| 5,536,584 | 7/1996 | Sotokawa et al. | 428/458 |
| 5,543,335 | 8/1996 | Zommer | 437/10 |

*Primary Examiner*—Sheila V. Clark
*Attorney, Agent, or Firm*—Townsend and Townsend and Crew LLP

[57] ABSTRACT

A semiconductor device structure in which a power semiconductor device is used as the substrate for the structure. Initially, a first metallization layer is formed on the power semiconductor device. Then, a dielectric passivation layer is formed over the first metallization layer, the dielectric passivation layer having apertures through which the first metallization layer may be accessed. A polymer passivation layer is then formed on the dielectric passivation layer, the polymer passivation layer also having apertures through which the first metallization layer and the dielectric passivation layer may be accessed. A second metallization layer is then formed on the polymer passivation layer and at least one electronic component is attached to the polymer passivation layer or the second metallization layer. The polymer passivation layer provides galvanic isolation between the power semiconductor device and the electronic component.

18 Claims, 3 Drawing Sheets

ISOLATED MULTI-CHIP DEVICES

CROSS REFERENCE TO A RELATED APPLICATION

This application is a continuation in part of the co-pending application Seri. No. 08/057,291 entitled "Isolated Multi-Chip Devices" by Nathan Zommer, filed May 5, 1993, which is herein incorporated by reference for all purposes.

BACKGROUND OF THE INVENTION

This invention relates to a semiconductor device structure and method wherein a power semiconductor device is employed as a substrate upon which other electronic components are disposed.

Power semiconductor devices are devices that control or convert electric power. These devices are used in a wide variety of applications, including power supplies, motor control systems, lighting ballasts, battery chargers, vehicular power systems, and so forth. Applications may be relatively low voltage and high current, such as a battery-charging applications, or may be high voltage with either high or low current, such as vehicular power systems or power supplies. As used herein, the term "power semiconductor device" relates to a semiconductor component that controls or dissipates at least one Watt of power at an operating voltage over 30 volts. Examples of such devices include, but are not limited to, diodes, rectifiers, thyristors, insulated-gate bipolar transistors (IGBTs), power metal-oxide-semiconductor field-effect transistors (MOSFETs), power Schottky diodes, and similar devices.

In the past, multi-chip power circuits have been designed in which a power semiconductor device was employed as a substrate upon which low voltage control circuitry was mounted. Previous techniques for galvanically isolating the power device from its associated control circuitry have achieved galvanic isolation on the order of 500 volts. The use of passivation materials having greater isolating characteristics has been problematic in that other characteristics of these materials have limited the manner in which the forward voltage drop of the power device may be reduced. For example, the low temperature tolerance of some passivation materials have made it impossible to perform high temperature processing (e.g., furnace anneal) of the power device to ensure a low voltage drop through the device.

Therefore, because of the relatively low galvanic isolation achieved by previous multi-chip techniques, there is a need for a multi-chip structure and method which achieve greater isolation between a power semiconductor device substrate and its associated low voltage control circuitry.

SUMMARY OF THE INVENTION

The invention provides a semiconductor device structure and a method for producing the structure in which a power semiconductor device is used as the substrate for the structure. The invention provides a higher operating temperature and greater reliability than previously possible.

The structure comprises the following elements: a first metallization layer formed on a power semiconductor device; a first passivation layer formed above the first metallization layer; a polymer passivation layer formed above the first passivation layer; and a second metallization layer formed above the polymer passivation layer and at least one electronic component mounted to the second metallization layer.

In specific embodiments the first passivation layer comprises a dielectric material, such as an oxide, a nitride, glass, or ceramic, the first passivation layer having apertures through which the first metallization layer may be accessed. The first metallization layer is the layer in which die attach pads and conductors for the underlying semiconductor device may be formed. Also, in specific embodiments, the polymer passivation layer comprises polyimide, and has apertures through which the first metallization layer and the first passivation layer may be accessed. The apertures in the passivation layers may be formed using standard photo-masking techniques. In fact, one of the advantages of the invention is that it can be produced using standard fabrication techniques. Specific embodiments also include structures in which the electronic components attached to the second metallization layer comprise at least one integrated circuit die. The structure and method of the present invention are able to produce a power electronic circuit with full galvanic isolation between components of up to 2,400 volts.

A further understanding of the nature and advantages of the present invention may be realized by reference to the remaining portions of the specification and the drawings.

DESCRIPTION OF THE SPECIFIC EMBODIMENTS

Figure 1A:
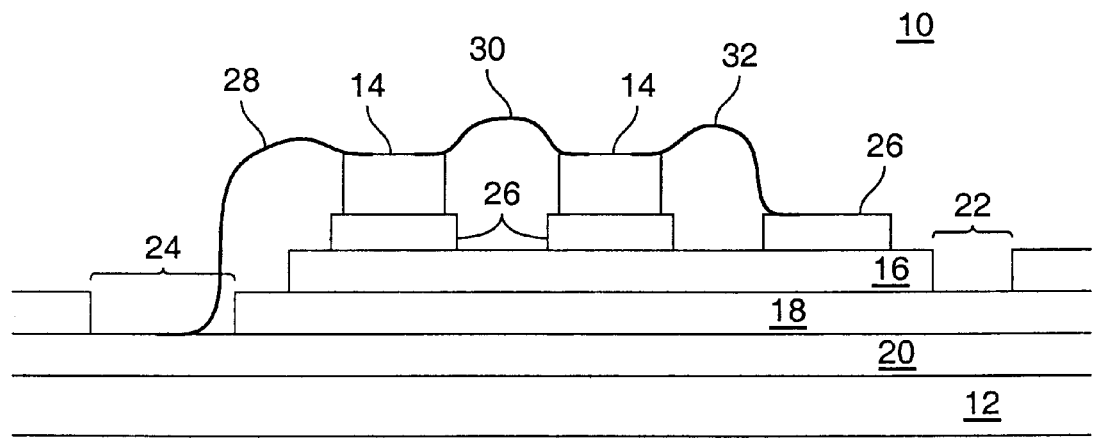
FIG. 1A is a cross-sectional view of a multi-chip structure according to the present invention.

FIG. 1A is a cross-sectional view of a multi-chip structure 10 fabricated according to the present invention. In this embodiment of the invention, a power semiconductor device 12 is employed as a substrate for a multi-chip structure 10. Power device 12 may be fabricated according to a new method for fabricating low-drop power devices using polymer passivation materials, described in the commonly assigned U.S. Pat. No. 5,543,335, entitled ADVANCED POWER DEVICE PROCESS FOR LOW DROP, by Nathan Zommer, incorporated herein for all purposes. Power device 12 is controlled by electronic components 14, which include integrated circuit dice and other electrical components that may operate at a lower voltage than the power device 12. These components are mounted, or die attached, to the top surface of a multi-layer structure formed on power device 12, and may be made from the same substrate material, or a different substrate material than the power device. For example, the electronic components 14 may be made from silicon, and the power device 12 may be made from gallium arsenide, silicon carbide, or other material. This provides enhanced functionality compared to a single-chip device, as fabricating the power device from a material different from the electronic components may provide superior characteristics, such as power capacity or speed of operation.

This multi-layer structure includes, starting from the bottom, a first metallization layer 20, a dielectric passivation layer 18, a polymer passivation layer 16, and a second metallization layer 26. Polymer passivation layer 16 is formed during the power device processing using any number of well known methods, and provides a high galvanic isolation between components 14 and power device 12. Polymer passivation layer 16 is relatively thick in comparison with typical semiconductor fabrication dimensions (i.e., greater than 1 micron ($10^{-6}$ meter)).

Dielectric passivation layer 18 is composed of glass (i.e., silicon based glass, $SiO_2$), silicon nitride (i.e., $Si_3N_4$), or any combination thereof, and is disposed on top of first metallization layer 20. Polymer passivation layer 16 is formed on top of dielectric 18. The polymer and dielectric layers are patterned to form apertures 22 and 24 through which both dielectric layer 18 and power device first metallization layer 20 may be accessed respectively. Polymer layer 16 may be treated essentially as a printed circuit board, with a second metallization layer 26 deposited on top of it. Any compatible metal for semiconductor processing may be used, such as aluminum, copper, silver, gold, tin, and alloys. Patterns of bonding pads, die attach areas, and conductor lines may be formed in the second metallization layer 26. Components 14, including integrated circuit dice and other electronic components, may then be attached to the second metallization layer 26 and wire-bonded according to the desired circuit pattern. Wire bonding may be achieved between the low voltage dice 14 and power device 12 (wires 28), between two or more of the low voltage dice themselves (wires 30), and between the low voltage dice and pads of the second metallization layer 26 (wires 32).

The high voltage isolation between the circuit dice is determined by the thickness of polymer 16 and other spatial layout design parameters. The key to obtaining high isolation with such a composite integrated device is the use of a polymer material which is compatible with integrated circuit and semiconductor processing, the material having the following characteristics:

a) can withstand temperatures up to 450° C.;
b) can be patterned using standard photoresist developing;
c) is clean to MOS level, low sodium and other impurities;
d) can withstand high voltage and is compatible with the high surface fields of the power device;
e) forms a solid, hard film after polymerization; and
f) exhibits good adhesion characteristics with respect to glass, ceramic, and metal, both above and below the material.

A typical choice of polymer passivation material is polyimide. The recommended thickness is from approximately 3 microns up to 10 microns, depending upon the desired isolation. With the use of sufficiently thick polymer (i.e., 5 micron polyimide) die attach pads can be placed on the polymer surface directly above the active area of the power device.

It is important that the polymer passivation layer 16 be able to withstand temperatures up to 450° C. for several reasons. First, it allows lowering the forward voltage drop of the power semiconductor device by implanting and diffusing impurities into the backside of the power semiconductor device after the polymer passivation layer has been formed, as discussed in above-referenced U.S. Pat. No. 5,543,335. Second, it allows the multi-chip device 10 to be operated at elevated temperatures. Elevated temperatures may arise because of the ambient operating environment of the multi-chip device or because of the power dissipation of the multi-chip device, resulting from either the power dissipation of the power device 12 or from one of the components 14. An example of an operating environment that may produce elevated operating temperatures is an application of a multi-chip device within an automotive engine compartment. Third, a high-temperature polymer passivation layer allows a high-temperature die attach process to be used to attach a component 14 to the power device 12, resulting in a superior attachment.

Figure 1B:
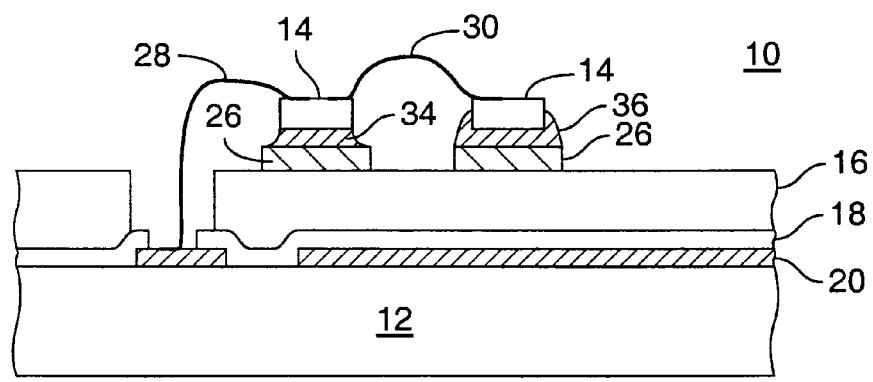
FIG. 1B is a detailed cross-sectional view of electronic components die attached to the second metallization layer and to the polymer passivation layer.

FIG. 1B is a detailed cross section of a component 14 attached to the second metallization layer 26, which overlies the polymer passivation layer 16. The component 14 may be attached to the multi-chip device 10 in a variety of fashions. A solder layer 34 has been formed between the component 14 and the second metallization layer 26. Any solder process that is compatible with the polymer passivation layer 16 may be used. Low-temperature solders, such as lead-based solders, tin-based solders, indium-based solders and their equivalents may be used. Specific examples include solders made from 60% lead and 40% tin; 92.5% lead, 5% tin, and 2.5% silver; and 80% tin, 15% antimony, and 5% indium. The solder may be applied by silkscreening solder paste onto either component, dipping, providing a solder preform, or manually applying solder during the die attach process. Soldering the electronic component to the second metal layer provides good thermal coupling, a strong, reliable mechanical attachment, and a low-resistance electrical contact to the second metal layer.

As an alternative to soldering the component 14 to the second metal layer 26, the component may be attached with a conductive adhesive, such as silver-filled or gold-filled epoxy 36. Such conductive adhesives are well-known to those in the art, and provide a simpler and potentially less expensive technique for attaching the die. Using a conductive adhesive to attach a component die to the second metal layer may be appropriate for multi-chip devices where the die is not likely to see temperatures above the maximum operating temperature of the conductive adhesive, typically about 100° C. for epoxies.

In some instances it may be desirable to combine epoxy and solder die attach methods to fabricate the multi-chip device. For example, one electric component may dissipate a significant amount of heat, requiring the use of solder, while another may not, thus allowing the use of epoxy.

Figure 1C:
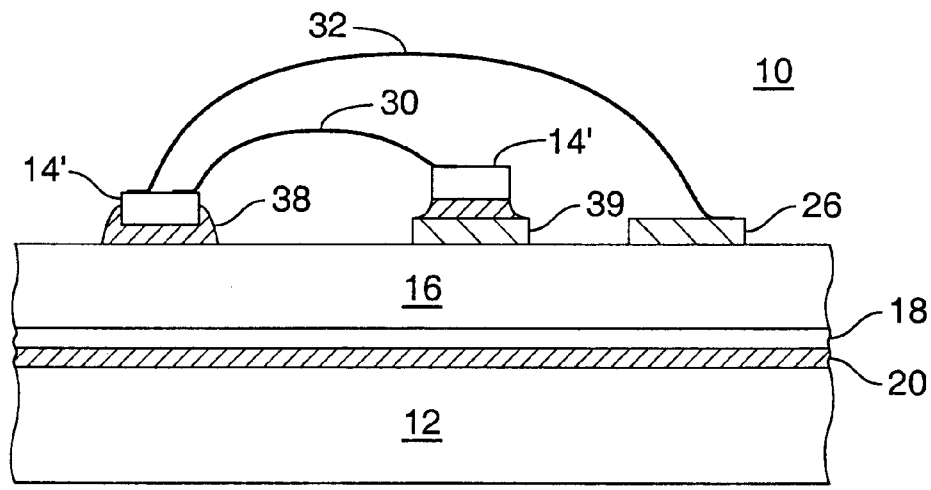
FIG. 1C is a detailed cross sectional view of an electronic component die attached to the polymer passivation layer.

FIG. 1C shows a detailed cross section of an electronic component 14 attached to the polymer passivation layer 16 with an adhesive 38. This embodiment is appropriate if the electronic component 14 does not need to be mechanically or electrically coupled to the second metal layer 26. An example is attaching a magnetic sensor to an electric motor control multi-chip device, mounted in close proximity to an electric motor, to detect the magnetic fields if the motor is running. Such a device generates negligible heat and may not have a backside contact that requires an electrical connection to a die attach pad. Therefore, it is possible to mechanically attach the component to the polymer passivation layer with an adhesive. The adhesive need not be conductive, and an adhesive appropriate for the fabrication or operating temperature of the multi-chip device may be chosen, such as a silicon or acrylate adhesive. However, it is specifically noted that the polymer passivation layer 16 provides galvanic isolation between the component 14' and the power device 12. Alternatively, an electrically isolated metal die attach pad 39 could be defined on the polymer passivation layer 16, and the component 14' may be soldered to this electrically isolated pad, thus providing superior mechanical support, improved thermal coupling, and higher operating temperature. The component 14' may be electrically coupled to other components (wire 30) or to a metallization layer 26 (wire 32).

Figure 2:
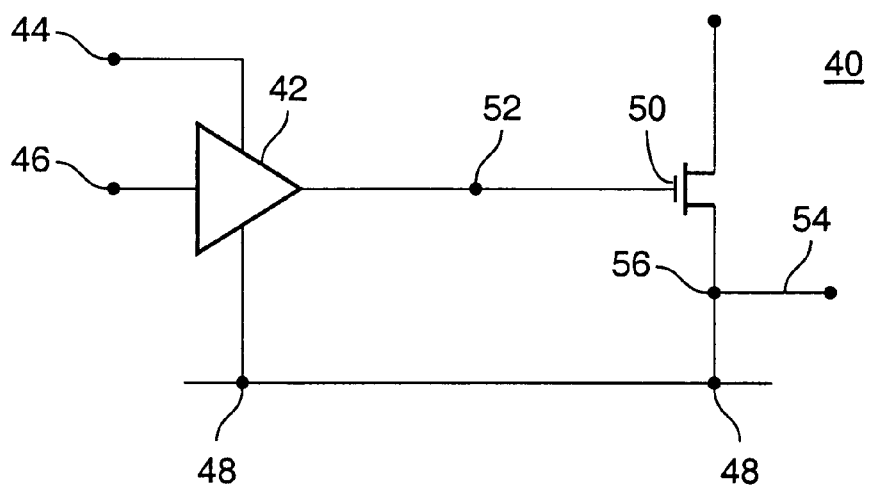
FIG. 2 is a schematic representation of a power device and its associated integrated circuit driver.
Figure 3:
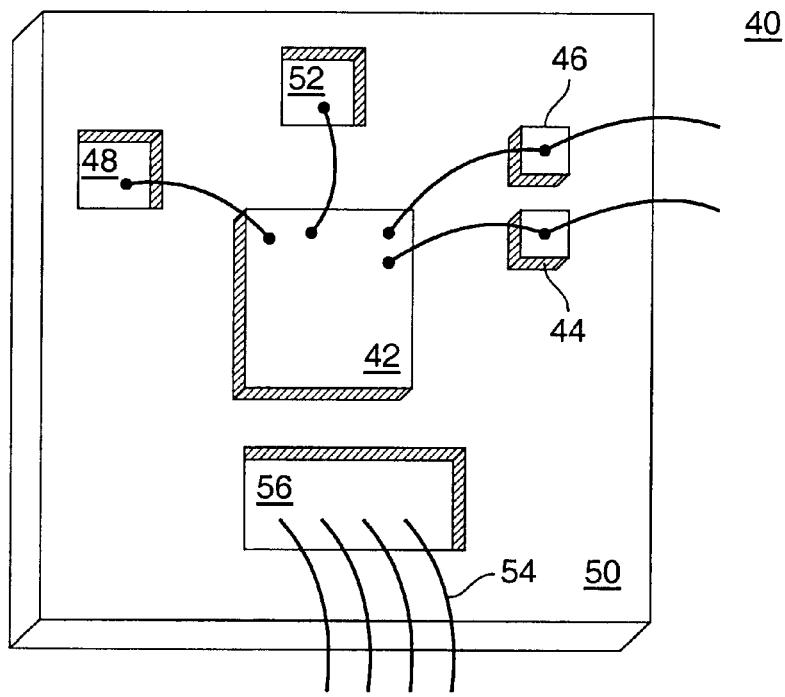
FIG. 3 is a top view of the multi-chip structure according to the present invention represented schematically in FIG. 2.

FIG. 2 schematically shows a typical circuit 40 to be implemented according to the invention. FIG. 3 shows a structural top view of the same circuit. Circuit 40 is a driver integrated circuit 42 on top of and controlling a power device 50. Driver IC 42 is connected to metal bonding pads 44 and 46, providing power and input signals respectively. Driver IC 42 is also connected to ground 48 of power device 50. The output terminal of driver IC 42 is connected to gate 52 of power device 50. Source power wires 54 are connected to source 56 of power device 50.

Figure 4:
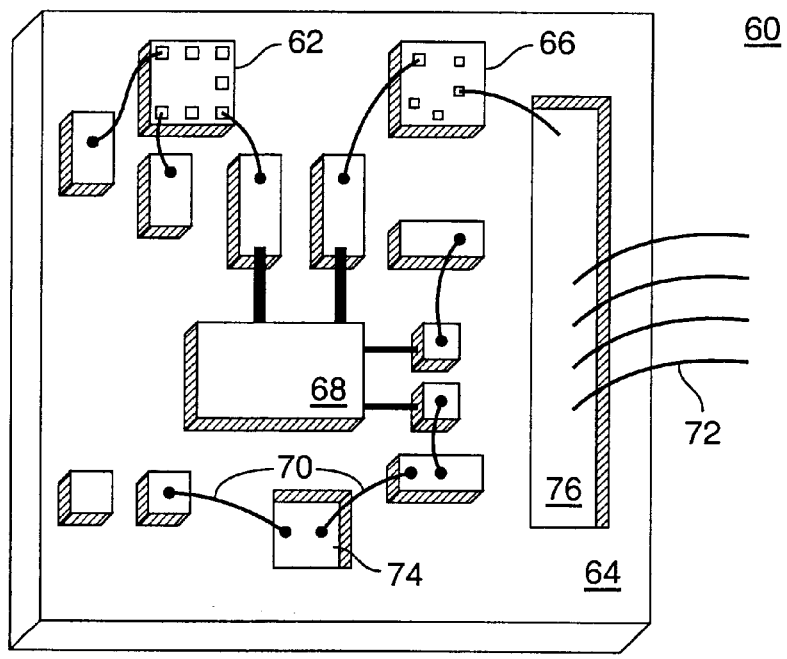
FIG. 4 is a top view of an additional embodiment of a multi-chip structure according to the present invention.

FIG. 4 shows another implementation of the present invention, namely multiple integrated circuit dice and conductors with drive isolation mounted on a multi-chip structure 60. Multi-chip structure 60 utilizes a driver IC 62 to control a power device 64, while a driver sensor IC 66 provides feedback from the power device's source region 76. A transformer or optocoupler 68 provides the drive isolation. Gate and source wires 70 and 72 access the surface of the power device active regions, namely gate 74 and source 76.

The following are steps in a method for fabricating a device according to the invention:

a) Depositing an oxide, nitride, glass, or ceramic passivation on a power device wafer.

b) Depositing a polymer passivation.

c) Depositing a photoresist.

d) Photomasking to define windows in the polymer and dielectric passivation layers.

e) Etching photomask pattern.

f) Curing polymer passivation.

g) Depositing a top metallization layer.

h) Photomasking to define die pads, wire bonding and conductor pads.

i) Further processing not in excess of 400° C. (approximate). After processing and probing finished wafers are ready for sawing or other dicing techniques. Individual dice are then selected for assembly.

j) Die attaching "power dice" in a suitable package.

k) Attaching ICs and other components that need to be attached on top of the power device.

l) Wire bonding all the components according to the desired circuit pattern.

m) Sealing, potting, or otherwise encapsulating the structure.

In conclusion, it can be seen that the present invention allows the construction of multi-chip devices possessing excellent electrical isolation properties. While the invention has been particularly shown and described with reference to a specific embodiment thereof, it will be understood by those skilled in the art that the foregoing and other changes in the form and details may be made therein without departing from the spirit or scope of the invention.

What is claimed is:

1. A semiconductor device structure, comprising:

a power semiconductor device which is used as a substrate for the structure;

a first metallization layer formed on the power semiconductor device;

a first passivation layer formed on the first metallization layer;

a second passivation layer formed on the first passivation layer, the second passivation layer comprising a polymer;

a second metallization layer formed on the second passivation layer; and at least one electronic component soldered to the second metallization layer, wherein the second passivation layer provides galvanic isolation between the power semiconductor device and the electronic component and wherein the second passivation layer is capable of withstanding temperatures greater than about 100° C.

2. The semiconductor device structure of claim 1 wherein the electronic component is soldered to an electrically floating die attach pad of the second metallization layer.

3. The semiconductor device structure of claim 1 wherein the electric component is soldered to the second metallization layer with a low-melting-point solder.

4. The semiconductor device structure of claim 3 wherein the low-melting-point solder comprises lead.

5. The semiconductor device structure of claim 3 wherein the low-melting-point solder comprises tin.

6. The semiconductor device structure of claim 3 wherein the low-melting-point solder comprises antimony.

7. The semiconductor device structure of claim 1 further comprising a second electronic component attached to the second metallization layer with a conductive adhesive.

8. The semiconductor device structure of claim 7 wherein the conductive adhesive comprises epoxy.

9. The semiconductor device structure of claim 1 further comprising a second electronic component attached to the second passivation layer with an adhesive.

10. The semiconductor device structure of claim 9 wherein the adhesive is a non-conductive adhesive.

11. The semiconductor device structure of claim 10 wherein the non-conductive adhesive comprises silicone.

12. The semiconductor device structure of claim 1 wherein the electronic component is fabricated from silicon and the power semiconductor device is fabricated from a semiconductor other than silicon.

13. A semiconductor device structure, comprising:

a power semiconductor device which is used as a substrate for the structure;

a first metallization layer formed on the power semiconductor device;

a first passivation layer formed on the first metallization layer;

a second passivation layer formed on the first passivation layer, the second passivation layer comprising a polymer;

a second metallization layer formed on the second passivation layer; and at least one electronic component die attached to the second metallization layer with a conductive adhesive, wherein the second passivation layer provides galvanic isolation between the power semiconductor device and the electronic component.

14. The semiconductor device structure of claim 13 wherein the conductive adhesive comprises epoxy.

15. A semiconductor device structure, comprising:

a power semiconductor device which is used as a substrate for the structure;

a first metallization layer formed on the power semiconductor device;

a first passivation layer formed on the first metallization layer;

a second passivation layer formed on the first passivation layer, the second passivation layer comprising a polymer; and at least one electronic component attached to the second passivation layer with an adhesive, wherein the second passivation layer provides galvanic isolation between the power semiconductor device and the electronic component.

16. The semiconductor device structure of claim 15 wherein the adhesive comprises silicon.

17. The semiconductor device structure of claim 15 wherein the adhesive comprises acrylate.

18. The semiconductor device structure of claim 15 wherein the adhesive comprises epoxy.

* * * * *